Jan. 24, 1961 W. A. SCHNEIDER 2,969,471
CRYSTAL TEMPERATURE CONTROL DEVICE
Filed Oct. 30, 1959
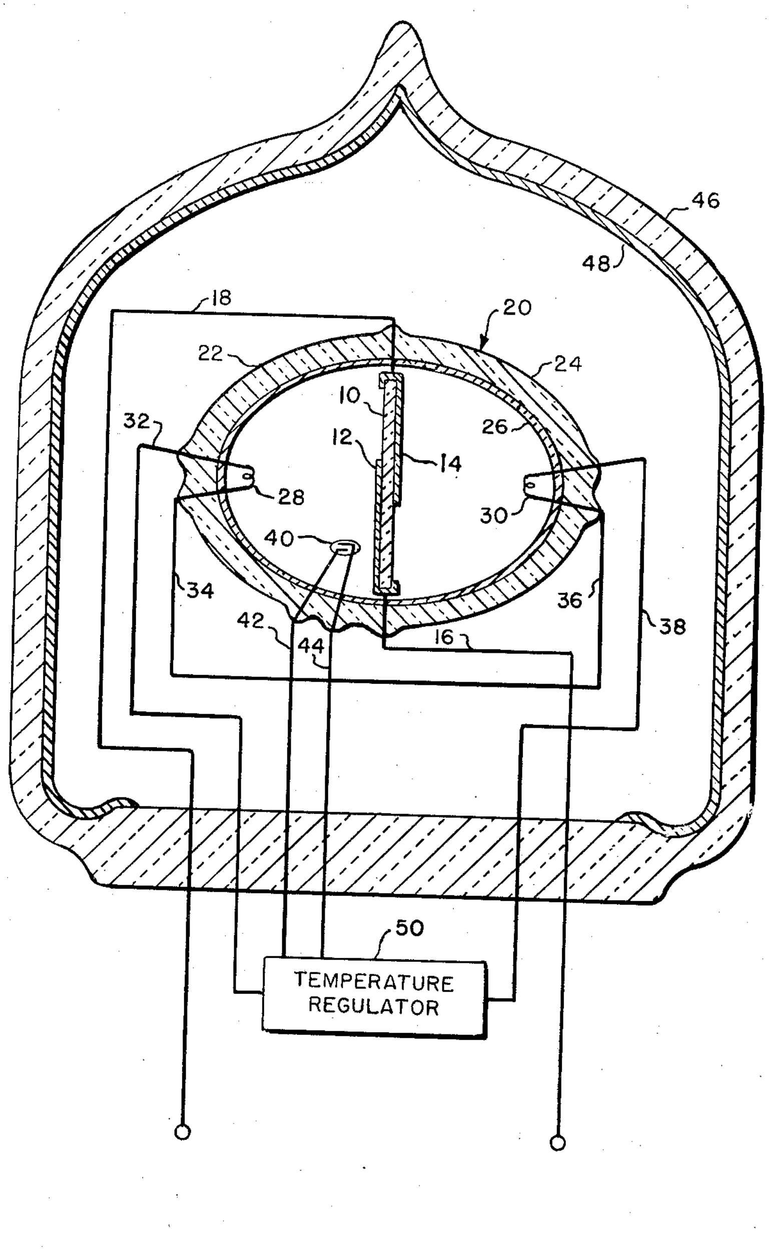
INVENTOR,
WILHELM A. SCHNEIDER.
BY
Harry M. Saragovitz
ATTORNEY.

2,969,471

CRYSTAL TEMPERATURE CONTROL DEVICE

Wilhelm A. Schneider, 70 Hendrickson Place, Fair Haven, N.J.

Filed Oct. 30, 1959, Ser. No. 850,000

5 Claims. (Cl. 310—8.9)

The invention described herein may be manufactured and used by or for the Government for governmental purposes without the payment of any royalty thereon.

This invention relates to temperature control arrangements for piezoelectric crystals.

Piezoelectric crystals have been widely used in various types of electronic equipment for precise control of the frequency of oscillation. The effectiveness of the piezoelectric crystal for such purposes depends upon the accuracy with which the crystal temperature is maintained since change in the temperature of a crystal generally has substantial influence on its frequency characteristics. Such a temperature would conveniently be above the highest ambient temperature likely to be encountered around the equipment in which the crystal is used. The requirements of such temperature controlled crystal units with respect to the heating power for maintenance of a constant crystal temperature are, for fixed installations, of relatively minor importance. However, in those cases where a considerable degree of mobility is required and where weight and space considerations are important, the use of the temperature controlled crystal has been seriously handicapped.

An object of this invention is to provide piezoelectric crystal heating apparatus which is of simple and inexpensive construction.

Another object is to provide a crystal heating unit which maintains a crystal closely within desired temperature limits, as regulated by a sealed thermistor.

Another object of the invention is to provide a crystal unit for which the heating power requirement is a small fraction of that required with prior art crystal temperature controlling means.

In accordance with the present invention there is provided a piezoelectric crystal temperature control device that contemplates enveloping the crystal in a glass chamber that is then evacuated or filled with an inert gas to provide a sealed inert atmosphere. The chamber includes double concave reflectors with heating elements at the respective focal points to direct radiant heat to the crystal mounted therebetween. Also contained in he chamber is a thermistor which is coupled to the heating elements through an external temperature regulator, thus permitting the chamber to be maintained at a constant temperature.

For a more detailed description of the invention, together with other and further objects thereof reference is had to the single figure of the accompanying drawing, which is a sectional view of a crystal temperature control device according to the invention.

Referring to the drawing, there is shown a standard disc type of piezoelectric crystal wafer 10, widely used in electronic devices, provided with metal contact strips 12 and 14 disposed on opposite surfaces of crystal 10. Crystal 10 is supported by leads 16 and 18 secured to the metal contacts 12 and 14, respectively, by suitable means, such as soldering or clamping.

A hollow dielectric chamber 20, such as glass, comprising two similar cups 22 and 24, sealed together along their circular bases, encases crystal 10 in non-contacting relation therebetween. The periphery of crystal 10 is in a plane parallel to the bases of cups 22 and 24 and the crystal is supported in fixed position by leads 16 and 18 sealed therein and extending externally intermediate the two cups. Chamber 20 is provided with an interior reflecting surface 26 which forms opposed elliptical reflectors, as shown, which may be of any suitable concave configuration such as a double parabola or circle. At each focus of the reflectors there is arranged heater elements 28 and 30, respectively, which may be electric resistance wire, such as Nichrome. Heater elements 28 and 30 are supported, respectively, by leads 32, 34, 36 and 38 which extend through and are sealingly engaged by chamber 20. A thermistor 40 is sealed within chamber 20 and is supported therein in close proximity to crystal 10 by leads 42 and 44 extending through the chamber and sealingly engaged therewith. Chamber 20 is evacuated or filled with an inert gas such as nitrogen, thus completely sealing the crystal in an air-tight controlled atmosphere.

Chamber 20 is encased in a dielectric envelope 46, such as those glass capsules used for standard subminiature receiver tubes, with the supporting leads passing through insulating eyelets in its base. Envelope 46 is evacuated and provided with an interior reflecting surface 48 to shield chamber 20 against undue heat loss.

The heating of crystal 10 is obtained by radiation from series connected heating elements 28 and 30 which in turn are connected to a conventional external temperature regulator 50 for energizing these elements through leads 32 and 38. Leads 42 and 44 are connected to temperature regulator 50 so that current to the heating elements 28 and 30 can be controlled by thermistor 40. As is well known, the properties of a concave reflector are such that a beam of radiant heat emanating from its focus and striking the reflecting surface will be projected in parallel rays such that if a similar reflector is opposed thereto, as is shown in the drawing, it will be reflected to the focus of the opposing reflector. It will thus be seen that crystal 10 and thermistor 40 placed in the above heat-obstructing position will be directly and uniformly heated by the reflected radiant heat waves and at the same time assure optimum temperature control of crystal 10.

The operation of the device above described is substantially as follows: After the crystal 10 is connected to a utilizing circuit through leads 16 and 18, temperature regulator 50 is turned on—by an external control not shown—and current is supplied to heater elements 28 and 30. When a predetermined temperature, for example 75° C., is reached temperature regulator 50 cuts off the current to heater elements 28 and 30. Thereafter, temperature regulator 50 closes and opens the circuit supplying current to heater elements 28 and 30 intermittently to maintain the temperature constant.

This invenion provides therefore, a crystal temperature control device which is of simple and inexpensive construction. The device may be easily adapted for enclosing crystals of different sizes and shapes, while at the same time it possesses a compact form which maximizes the use of allotted space in electronic equipment. Moreover, while the invention has been described with reference to a crytsal temperature control device, it is equally applicable to other temperature control arrangements or chambers such as those used for maintaining electrical or other elements at a constant temperature. Thus, what is said with respect to crystal temperature control devices applies also to other constant temperature apparatus where similar requirements must be met.

While there has been described what is at present considered a preferred embodiment of the invention, it will be obvious to those skilled in the art that various changes and modifications may be made therein without departing from the invention, and it is therefore aimed in the appended claims to cover all such changes and modifications as fall within the spirit and scope of the invention.

What is claimed:

1. A device for maintaining a piezoelectric crystal at a constant temperature comprising an air-tight chamber for containing a crystal, said chamber being provided on its inner wall with an interior reflecting surface forming opposed concave reflectors, a pair of electric heating elements respectively positioned at each focus of said concave reflectors and adapted to direct heat rays toward said crystal mounted therebetween, a thermistor supported in said chamber and adapted to control said heating elements, and connector means for making electrical connection to said heating elements and for energization thereof.

2. A constant temperature device according to claim 1, in which said opposed reflectors are elliptical in configuration and said thermistor is supported therebetween.

3. A device for maintaining a piezoelectric crystal at a constant temperature comprising an air-tight chamber for containing a crystal, said chamber being provided with an interior reflecting surface to form opposed elliptical reflectors, a pair of electric heating elements respectively positioned at each focus of said reflectors to direct heat rays to said crystal mounted therebetween, a temperature regulator, a thermistor mounted in said chamber and coupled to said heating elements through said temperature regulator to control said heating elements, and circuit means comprising a network for connecting said temperature regulator to said thermistor and to said heating elements for supplying a variable current thereto so as to maintain said chamber and said crystal at a constant temperature.

4. A device for maintaining a piezoelectric crystal at a constant temperature comprising an air-tight chamber for containing a crystal, said chamber being provided with an interior reflecting surface to form opposed elliptical reflectors, a pair of electric heating elements respectively positioned at each focus of said refletcors to direct heat rays to said crystal mounted therebetween, a thermistor mounted in said chamber and adapted to control said heating elements, circuit means for making electrical connection to said heating elements and for energization thereof, and a shield of dielectric material adapted to fit over and enclose said chamber for protection and heat insulation thereof.

5. A constant temperature device according to claim 4, in which said dielectric shield is an evacuated glass envelope provided with an interior reflecting surface.

References Cited in the file of this patent

UNITED STATES PATENTS

| | | |
|---|---|---|
| 2,438,345 | Miller | Mar. 23, 1948 |
| 2,660,680 | Koerner | Nov. 24, 1953 |